United States Patent [19]

Kanzaki

[11] Patent Number: 5,543,794

[45] Date of Patent: Aug. 6, 1996

[54] SUCCESSIVE APPROXIMATION ANALOG-TO-DIGITAL CONVERTER USING CMOS INVERTER WITH PULL-UP AND/OR PULL-DOWN SWITCHES

[75] Inventor: Teruaki Kanzaki, Itami, Japan

[73] Assignee: Mitsubishi Denki Kabushiki Kaisha, Tokyo, Japan

[21] Appl. No.: 203,055

[22] Filed: Feb. 28, 1994

[30] Foreign Application Priority Data

Mar. 5, 1993 [JP] Japan .................................. 5-045135

[51] Int. Cl.⁶ ..................................................... H03M 1/38
[52] U.S. Cl. ............................ 341/161; 341/155; 327/77
[58] Field of Search ................................. 327/210, 211, 327/437, 69, 77, 78, 81; 341/155, 156, 158, 159, 161, 162

[56]  References Cited

U.S. PATENT DOCUMENTS

| | | | |
|---|---|---|---|
| 4,316,105 | 2/1982 | Fowler | 327/69 |
| 4,539,551 | 9/1985 | Fujita et al. | 341/136 |
| 4,816,701 | 3/1989 | Ando et al. | 327/77 |
| 4,845,383 | 7/1989 | Iida | 341/158 |
| 4,893,124 | 1/1990 | Tsuji et al. | 341/156 |
| 5,144,310 | 9/1992 | Sato . | |
| 5,397,936 | 3/1995 | Wang | 327/77 |

FOREIGN PATENT DOCUMENTS

| | | | |
|---|---|---|---|
| 61-150518 | 7/1986 | Japan | 327/77 |
| 61-288615 | 12/1986 | Japan | 327/77 |

*Primary Examiner*—Howard L. Williams
*Attorney, Agent, or Firm*—Lowe, Price, LeBlanc & Becker

[57] ABSTRACT

According to the analog/digital converting apparatus of the invention, at the connecting part of the sampling capacity and inverter, there is provided an auxiliary circuit so that the potential at the connecting part reaches the clamp potential at high speeds, similar to a switching device set to invite the voltage application by a source voltage, and therefore, the conversion accuracy is not worsened, and the analog/digital conversion time is shortened even if the reference clock pulse is set at higher speeds.

16 Claims, 12 Drawing Sheets

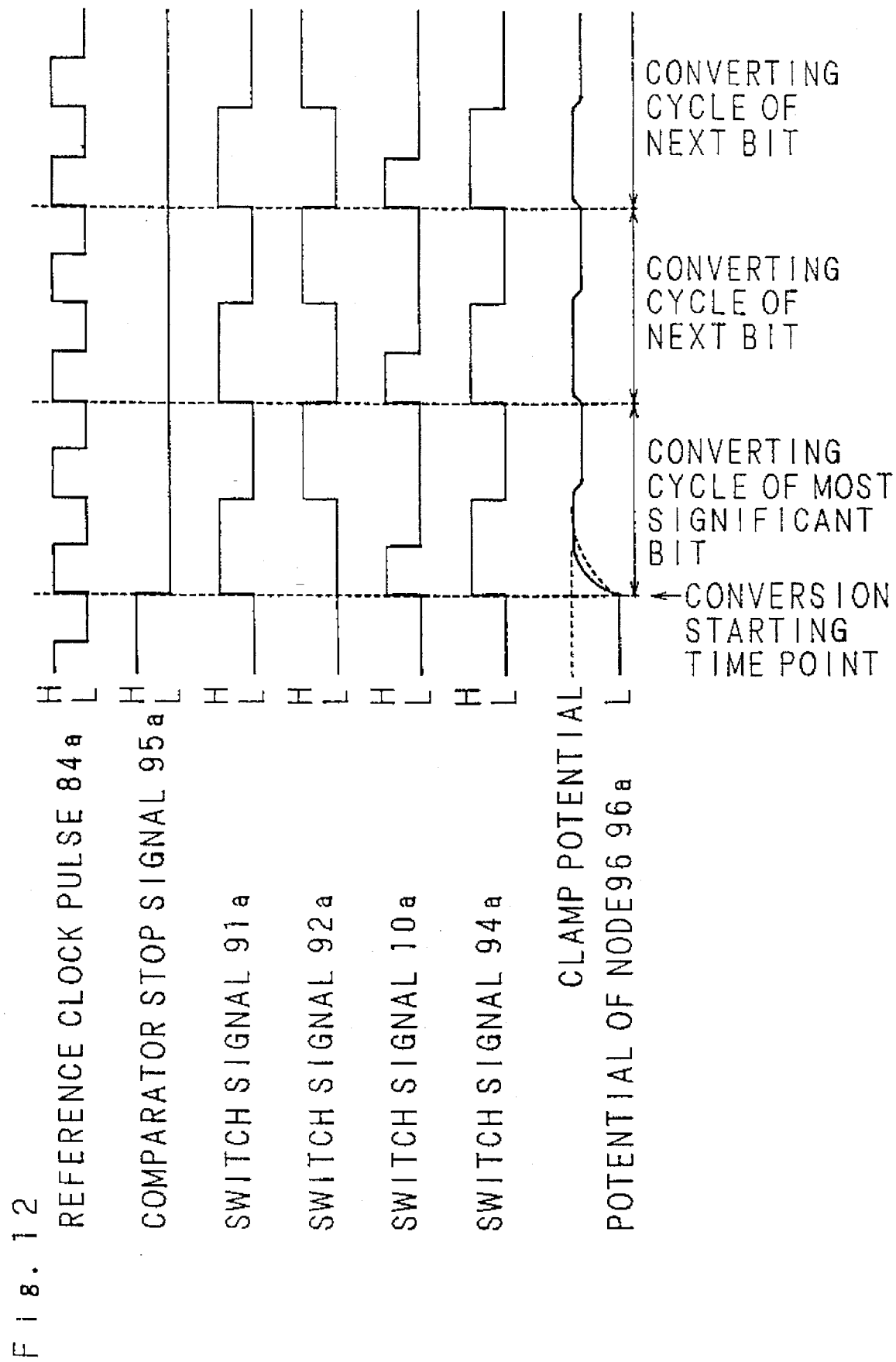

SUCCESSIVE APPROXIMATION ANALOG-TO-DIGITAL CONVERTER USING CMOS INVERTER WITH PULL-UP AND/OR PULL-DOWN SWITCHES

BACKGROUND OF THE INVENTION

1. Field of the Invention

The present invention relates to an analog/digital converting apparatus of the successive approximation system built in, for example a microcomputer.

2. Description of the Related Art

FIG. 1 is a block diagram showing the constitution of a general analog/digital converting apparatus of the successive approximation system. A reference voltage Vref is fed into a digital/analog converter (hereinafter called as a D/A converter) 181 which divides the reference voltage Vref. A divided reference voltage 188 output from the D/A converter 181 is fed into a negative input terminal of a comparator 182. To a positive input terminal of the comparator 182 is fed an analog input voltage AVin to be converted, and a comparison result 189 of the comparator 182 is sent to a successive approximation register 183.

The data of the successive approximation register 183 is read out into a bus BS. The bus BS is connected to a control circuit 184 via a write signal line 185. A reference clock pulse 184a is applied to the control circuit 184. A control signal 186 is supplied from the control circuit 184 to the D/A converter 181, and a comparator stop signal 195a is given to the comparator 182. Between the control circuit 184 and successive approximation register 83, a signal 187 is put in and out.

FIG. 2 is a circuit diagram showing the constitution of the conventional comparator 182. A voltage input terminal X1 in which an analog input voltage AVin is fed is connected with one terminal of a sampling capacity 190. A voltage input terminal X2 to which the divided reference voltage 188 delivered from the D/A converter 181 is fed is connected to the one terminal of the sampling capacity 190 via an N-channel transistor 192. The other terminal of the sampling capacity 190 is connected to an input terminal of a CMOS inverter 193 for amplification (hereinafter called as an inverter 193), and is grounded via an N-channel transistor 195.

To the inverter 193 is converted a feedback N-channel transistor 194 in parallel to each other, and an output terminal of the inverter 193 is connected with a comparison result output terminal X3 which outputs the comparison result 189. Switch signals 191a, 192a are fed to the gates of the transistors 191, 192, while a switch signal 194a and the comparator stop signal 195a are fed to the gates of transistors 194, 195.

FIG. 3 is a block diagram showing the constitution of the conventional control circuit 184. The bus BS is connected to a start flag 102 via the write signal line 185. The comparator stop signal 195a output from the start flag 102 is fed into a frequency divider 103 and a D/A converter control circuit 101, and is output from the control circuit 184. The frequency divider 103, receiving the reference clock pulse 184a, generates switch signals 191a, 192a, 194a. The signal 187 is put in and out of the D/A converter control circuit 101 which in turn outputs a control signal 186.

The operation of this analog/digital converting operations will be explained with reference to FIG.4 showing the timing chart of each signal. When the start of operation is instructed to the start flag 102 from the bus BS through the signal line 185, the comparator stop signal 195a becomes L level as shown in FIG. 4, and the analog/digital converting apparatus starts the converting operation. As the comparator stop signal 195a first becomes L level, the transistor 195 of the comparator 182 is turned off, and the inverter 193 is prepared to compare the voltages.

In order to convert into the most significant bit, the D/A converter 181 is so controlled by the D/A converter control circuit 101 as to generate half the reference voltage Vref, that is, ½ Vref, and the voltage is fed to the comparator 182. On the other hand, the frequency divider 103 sequentially divides the reference clock pulse 184a as the comparator stop signal 195a becomes L level, and generates switch signals 191a, 192a, 194a shown in FIG. 4. In the comparator 182, as indicated in FIG. 4, when the switch signal 191a becomes H level, the transistor 191 is turned on, and the analog input voltage AVin is unpressed to the sampling capacity 190 to charge the sampling capacity 190 at the same time, the switch signal 194a becomes H level, and the feedback transistor 194 is turned on. As the feedback transistor 194 is turned on, a node 196 which is an input terminal of the inverter 193 is clamped at the thresh-old voltage.

Subsequently, the switch signal 194a becomes L level as is clear from FIG. 4, and the feedback transistor 194 is turned off. At this time, the node 196 is kept at the clamp potential. Moreover, the switch signal 191a is turned to L level, and the transistor 191 is turned off, with the switch signal 192a switched to H level, and the transistor 192 turned on. As a result, the reference voltage 188 is sent to the sampling capacity 190 from the D/A converter 181.

In this case, when the reference voltage 188 from the D/A converter 181 is higher than the analog input voltage AVin, the sampling capacity 190 charged by the analog input voltage AVin is further charged, and the potential of the node 196 is increased. The increase of the potential of the node 196 means that a potential higher than the threshold value of the inverter 193 is given, resulting in the comparison result 189 of L level.

When the reference voltage 188 from the D/A converter 181 is lower than the analog input voltage AVin, the sampling capacity 190 is discharged, and the potential of the node 196 is lowered. The decrease of the potential of the node 196 indicates the supply of a potential lower than the threshold value of the inverter 193, and the comparison result 189 of H level is generated.

In this way, in accordance with the potential change of the node 196, the analog input voltage AVin and reference voltage 188 from the D/A converter 181 are compared with each other. The comparison result. 189 is output after binarized in the inverter 193. The comparison result 189 is stored in tile successive approximation register 183, and the converting operation into the most significant bit is hence terminated.

At the time of the conversion into a next bit, when the analog input voltage AVin is larger than half the reference voltage, i.e., ½ Vref in the previous conversion result 189, a voltage obtained by adding ½ of half the reference voltage ½ Vref, that is, a fresh reference voltage, 188 of ¾ the reference voltage Vref is output from the D/A converter 181, and is compared with the analog input voltage AVin by the comparator 182, the comparison result 189 is stored in the successive approximation register 183. In the previous conversion result 189, on the other hand, when the analog input voltage AVin is smaller than half the reference voltage Vref, a voltage attained by subtracting ½ of half the reference voltage ½ Vref, that is, a fresh reference voltage of ¼ the reference voltage Vref is generated from the D/A converter 181, and is compared with the analog input voltage AVin in the comparator 182, the comparison result 189 is stored in the successive approximation register 183.

At the further bit conversion, when the analog input voltage AVin is larger than ¾ of the reference voltage Vref according to the previous conversion result 189, a voltage with ½ of ¾ the reference voltage Vref added, that is, a new reference voltage 188 of ⅞ the reference voltage Vref is sent out from the D/A converter 181, to be compared with the analog input voltage AVin in the comparator 182, the comparison result 189 is stored in the successive approximation register 183. When the analog input voltage AVin is smaller than ¾ of the reference voltage Vref in the previous conversion result, a voltage obtained by subtracting ½ of ¾ the reference voltage Vref, namely, a reference voltage 188 of ⅝ the reference voltage Vref is output from the D/A converter 182, where the voltage is compared with the analog input voltage AVin, and the comparison result 189 is stored in the successive approximation register 183.

In the preceding comparison result 189, when the analog input voltage AVin is larger than ¼ of the reference voltage Vref, a voltage obtained by adding ½ of ¼ the reference voltage Vref, that is, a voltage of ⅜ the reference voltage Vref is output from the D/A converter 181, and compared with the analog input voltage AVin in the comparator 182, the comparison result 189 is stored in the successive approximation register 183. In the preceding conversion result 189, meanwhile, when the analog input voltage AVin is smaller than ¼ of the reference voltage Vref, a voltage obtained by subtracting ½ of ¼ the reference voltage Vref, that is, a reference voltage 188 of ⅛ the reference voltage Vref is generated from the D/A converter 181, and is then compared with the analog input voltage AVin in the comparator 182, the comparison result is stored in the successive approximation register 183.

In this way, while the reference voltage Vref is divided and the divided voltage is sequentially increased or decreased, if the increased or decreased voltage, specifically, the reference voltage 188 is larger than the analog input voltage AVin, the reference voltage is further processed through subtracting and compared, or when the reference voltage 188 is smaller than the analog input voltage AVin, a further divided voltage is added to the reference voltage and compared, the conversion is executed sequentially from the most significant bit to the least significant bit.

This series of comparing operations is controlled by the control circuit 184.

Incidentally, the node 196 shown in FIG. 4 assumes the potential 196a when the reference voltage 188 is smaller than the analog input voltage AVin detected through comparison between the analog input voltage AVin and reference voltage 188 from the D/A converter 181 in each conversion cycle. Therefore, when the switch signal 192a becomes H level to turn on the transistor 182, the sampling capacity 190 is discharged, and the potential 196a of the node 196 is lowered from that when the switch signal 191a is H level and the transistor 191 is turned on.

As mentioned above, in the comparator of FIG. 2, the potential 196a of the node 196 starts to change, as is understood from FIG. 4, from a time point when the comparator stop signal 195a is inverted to L level. It takes a long time for the node 196 to be clamped at the threshold voltage of the inverter 193 after the feedback transistor 194 is turned on. This phenomenon is brought about because of the initialization of the inverter 193. Therefore, when the speed of the reference clock pulse 184a is increased in order to shorten the analog/digital conversion time, the voltage comparison is feared to start before the potential 196a of the node 196 reaches the threshold voltage of the inverter 193 in the conversion of the most significant bit alone, and hence the conversion accuracy is worsened.

To avoid such inconveniences as above, it may be proposed to enhance the driving ability of currents of the inverter 193 and feedback transistor 194 so as to set the potential 196a of the node 196 at the clamp potential in a short time from the initial state. However, the inverter 193 would undesirably react to the incoming noise or switching noise of the internal transistor, resulting in the deterioration of the conversion accuracy.

SUMMARY OF THE INVENTION

The invention is devised to solve these problems, and it is hence a primary object of the invention to provide an analog/digital converting apparatus designed to shorten the conversion time without deteriorating the accuracy of the analog/digital conversion even if a reference clock pulse is increased in speed.

The analog/digital converting apparatus of the invention comprises a pull up switching device and a pull down switching device connected at the connecting part of a sampling capacity and an inverter, and a control circuit for making both switching devices conductive only in case of converting into most significant bit. Therefore, at the time of converting into the most significant bit, when the pull up switching device and pull down switching device are turned to be conductive, the potential at the connecting part of the sampling capacity and inverter is increased, whereby the connecting part reaches the clamp potential in a short time, thus realizing the state ready to compare the voltages correctly. Even if the voltages are compared at high speed, the analog/digital conversion accuracy is not lowered during the conversion into the most significant bit.

The analog/digit converting apparatus of the invention comprises a pull tip switching device connected at the connecting part of a sampling capacity and an inverter, and a control circuit for making the switching device conductive only when the most significant bit is to be converted. Therefore, when the pull rip switching device is rendered conductive at the time of converting into the most significant bit, the potential at the connecting part between the sampling capacity and inverter is increased, and the connecting part reaches the clamp potential in a short time, so that it is readily prepared to compare the voltages correctly. Hence, even if the voltages are compared at high speeds, the analog/digital conversion accuracy is not deteriorated at the time of the conversion into the most significant bit.

Furthermore, the analog/digital converting apparatus of the invention comprises a second inverter connected at the connecting part of a sampling capacity and an inverter, a switching device for feeding back an output of the second inverter to the input side thereof, and a control circuit for making the switching device conductive only at the time of the conversion of the most significant bit. Therefore, when the switching device is turned to be conductive at the time of the conversion into the most significant bit, the output of the second inverter is fed back to the input side, and the connecting part of the sampling capacity and inverter reaches the clamp potential in a short time, so that it is readily prepared to compare the voltages correctly. Even when the voltages are compared at high speeds, the analog/ digital conversion accuracy is not decreased at the time of the conversion into the most significant bit.

Moreover, the analog/digital converting apparatus of the invention comprises a circuit for generating a predetermined potential and connected at the connecting part of a sampling capacity and an inverter, a switching device for applying the predetermined potential generated in the circuit to the connecting part, and a control circuit for turning the switching device to be conductive only at the time of the conversion of the most significant bit. Therefore, when the switching device is turned to be conductive at the time of the conversion into the most significant bit, the predetermined potential is applied to the connecting part of the sampling capacity and inverter, and the connecting part reaches the clamp potential in a short time, so that, it is readily prepared to compare the voltages correctly. Even if the voltages are compared at high speeds, the analog/digital conversion accuracy is not lowered at the time of the conversion into the most significant bit.

Still more, the analog/digital converting apparatus of the invention comprises a pull up switching device and a pull down switching device connected at the connecting part of a sampling capacity and an inverter, and a control circuit for making conductive the pull up switching device, a switching device for feeding back an output of the inverter to the input side thereof, or a switching device for shutting or allowing a predetermined potential at the time of the conversion into each bit. Therefore, when the switching device is made conductive at the time of the conversion into each bit, the connecting part of the sampling capacity and inverter reaches the clamp potential in a short time, so that it is readily prepared to compare the voltages correctly. Hence, even if the voltages are compared at high speeds, the analog/digital conversion accuracy is not lowered at the time of the conversion into each bit. The above and further objects and features of the invention will more fully be apparent from the following detailed description with accompanying drawings.

BRIEF DESCRIPTION OF THE DRAWINGS

FIG. 12 is a timing chart of signals when the clamp potential is raised in a short time at the time converting into each bit.

DESCRIPTION OF THE PREFERRED EMBODIMENTS

Figure 5:
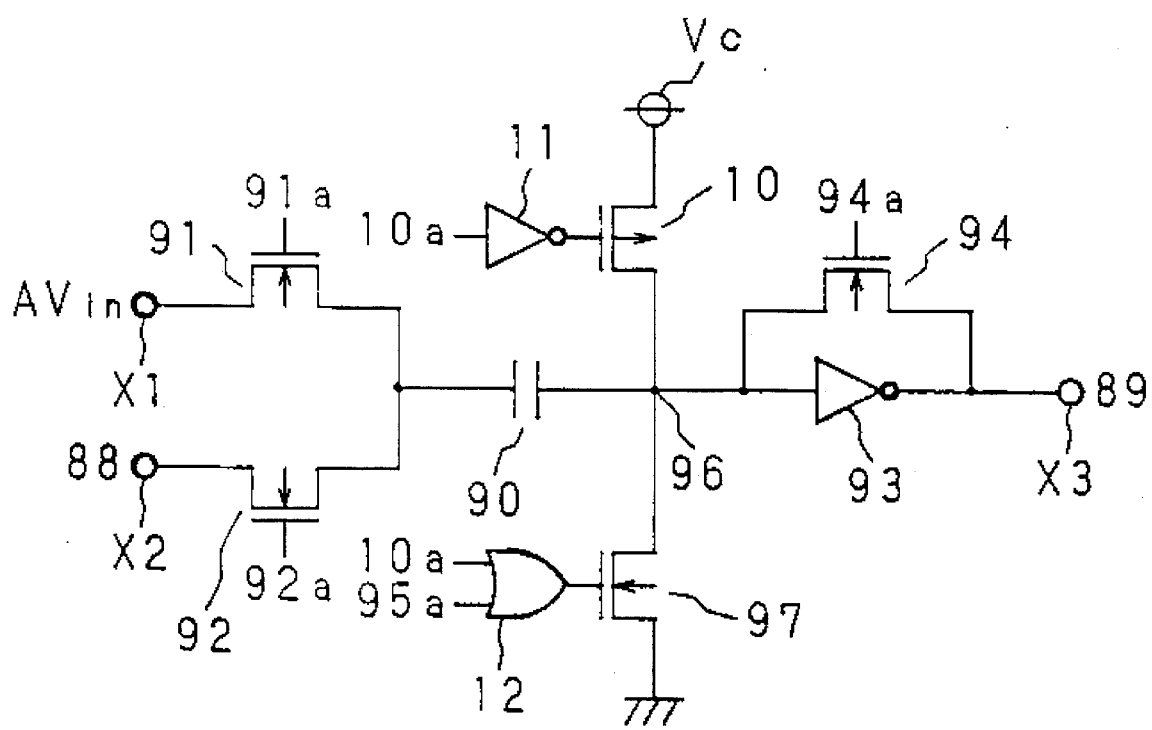
FIG. 5 is a circuit diagram showing the constitution of a first embodiment of a comparator in an analog/digital converting apparatus of the invention.
Figure 6:
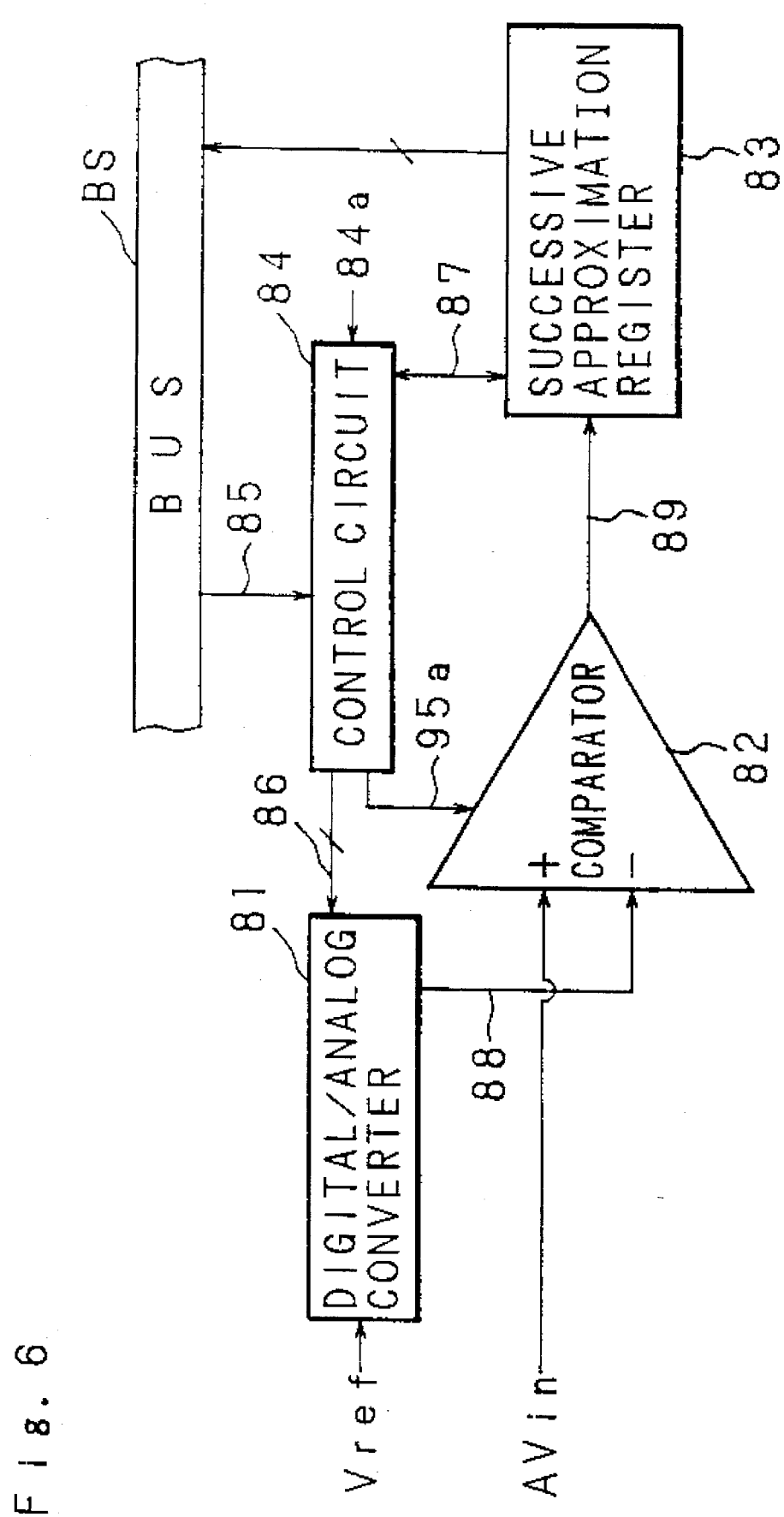
FIG. 6 is a block diagram showing the constitution of the analog/digital converting apparatus of the invention.

The invention will be described below by referring to the embodiments and corresponding accompanying drawings. FIG. 5 is a circuit diagram showing the constitution of a first embodiment of a comparator in an analog/digital converting apparatus of the invention, and FIG. 6 is a block diagram showing the constitution of an analog/digital converting apparatus of the successive approximation system of the invention. A reference voltage Vref is fed to a digital/analog converter (hereinafter referred to as a D/A converter) 81 which divides the reference voltage Vref. A divided reference voltage 88 generated from the D/A converter 81 is fed into a negative input terminal of a comparator 82. An analog input voltage AVin to be converted is supplied to a positive input terminal of the comparator 82, and a comparison result 89 from the comparator 82 is sent to a successive approximation register 83.

The data of the successive approximation register 83 is read out into a bus BS. The bus BS is connected to a control circuit 84 via a write signal line 85. A reference clock pulse 84a is given to the control circuit 84. A control signal 86 from the control circuit 84 is fed to the D/A converter 81, and a comparator stop signal 95a is applied to the comparator 82. A signal 87 is input and output between the control circuit 84 and successive approximation transistor 83.

A voltage input terminal X1 to which the analog input voltage AVin is input is connected to one terminal of a sampling capacity 90 via an N-channel transistor 91. A switch signal 91a is fed into a gate of the transistor 91.

A voltage input terminal X2 receiving the analog reference voltage 88 from the D/A converter 81 is also connected to the one terminal of the sampling capacity 90 via an N-channel transistor 92. A switch signal 92a is fed to a gate of the transistor 92. The other terminal of the sampling capacity 90 is connected to a comparison result output terminal X3 through which the comparison result 89 is output via the inverter 93. A feedback N-channel transistor 94 is connected in parallel to the inverter 93.

A switch signal 94a is input to a gate of the transistor 94. A node 96 at the connecting part of the sampling capacity 90 which is as the input side of the inverter 93 with the inverter 93 is connected to a DC power source Vc via a P-channel transistor 10 which is a pull up switching device, and is grounded via an N-channel transistor 97 as a pull down switching device. The switch signal 10a is fed into a gate of the P-channel transistor 10 through an inverter 11. The switch signal 10a and the comparator stop signal 95a are input respectively to one input terminal and the other input terminal of an OR circuit 12 the OR circuit 12 emits an output to a gate of the N-channel transistor 97.

Figure 7:
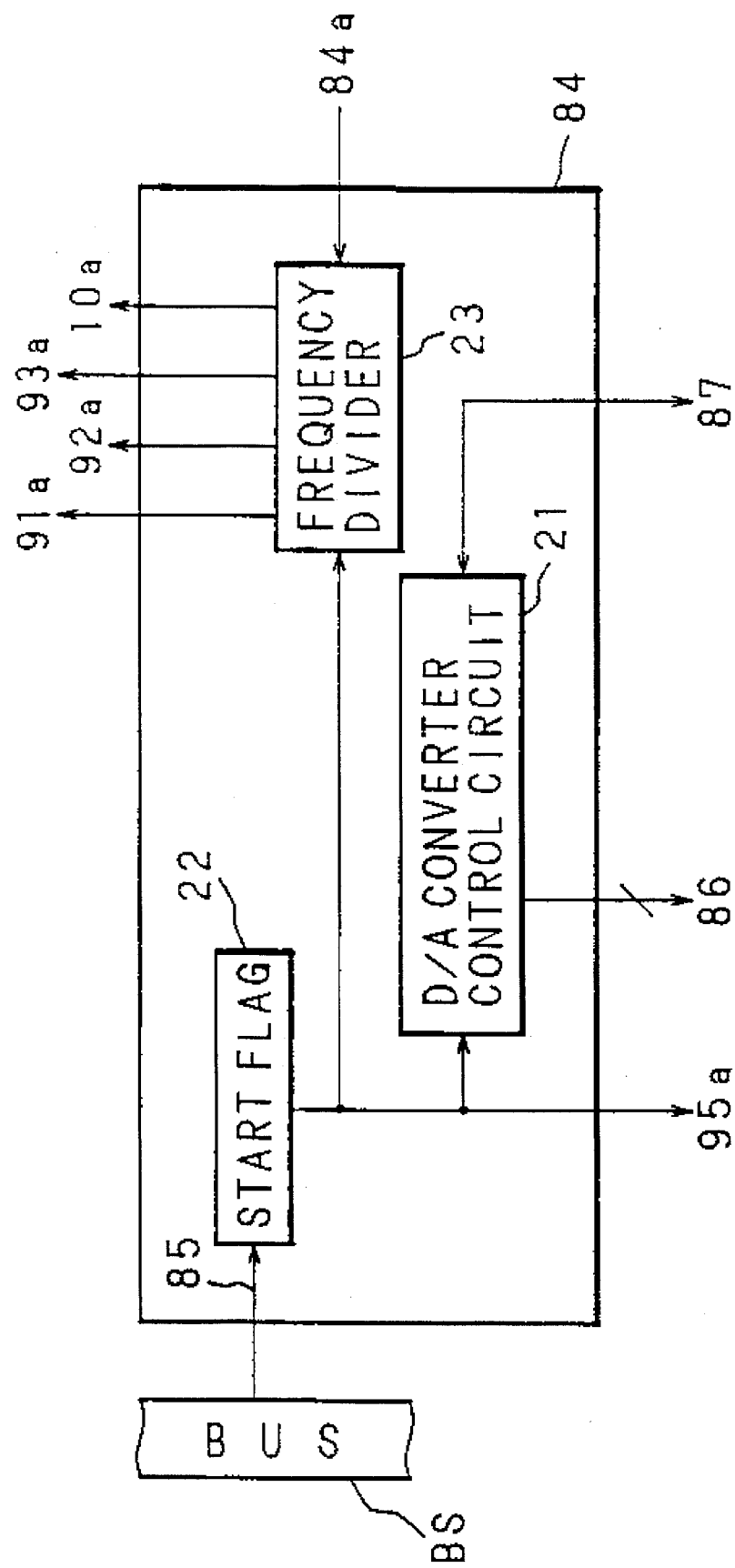
FIG. 7 is a block diagram showing the constitution of a control circuit of the invention.

FIG. 7 is a block diagram showing the constitution of the control circuit 84. The bus BS is connected to a start flag 22 via the write signal line 85. The comparator stop signal 95a from the start flag 22 is output to a frequency divider 23 and a D/A converter control circuit 21, to be sent out from the control circuit 84. The reference clock pulse 84a is fed into the frequency divider 23, and switch signals 91a, 92a, 93a, 10*a* are output from the frequency divider 23. The signal 87 is input and output to and from the D/A converter control circuit 21, which consequently generates the control signal 86.

Figure 1:
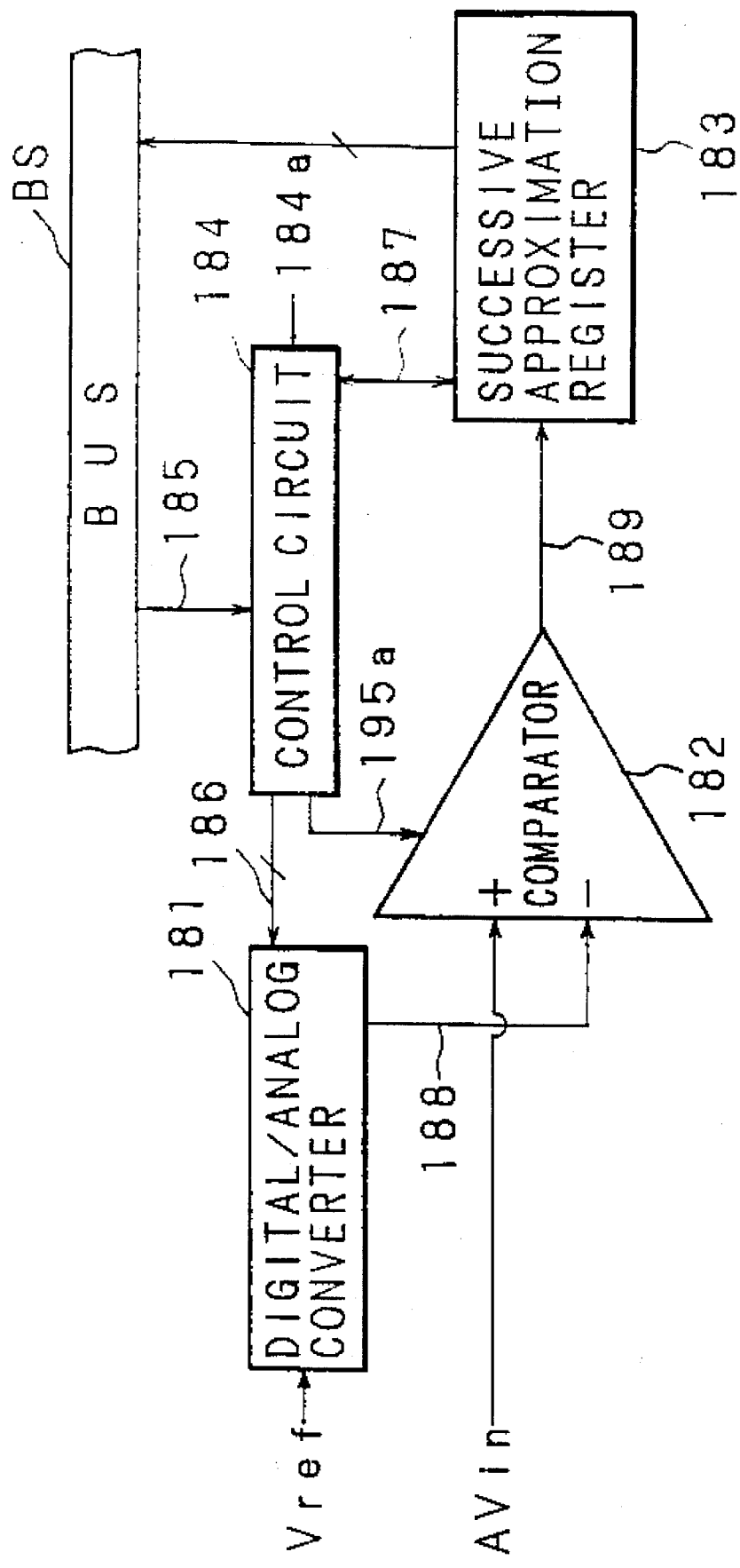
FIG. 1 is a block diagram showing the constitution of an analog/digital converting apparatus.
Figure 2:
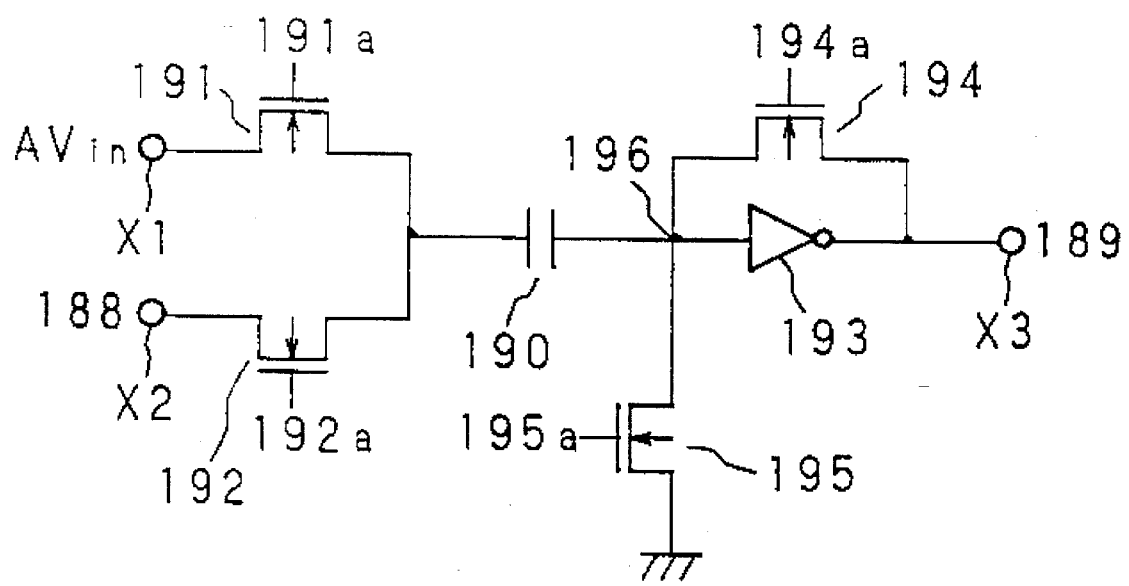
FIG. 2 is a circuit diagram showing the constitution of a conventional comparator in the analog/digital converting apparatus of FIG. 1.
Figure 3:
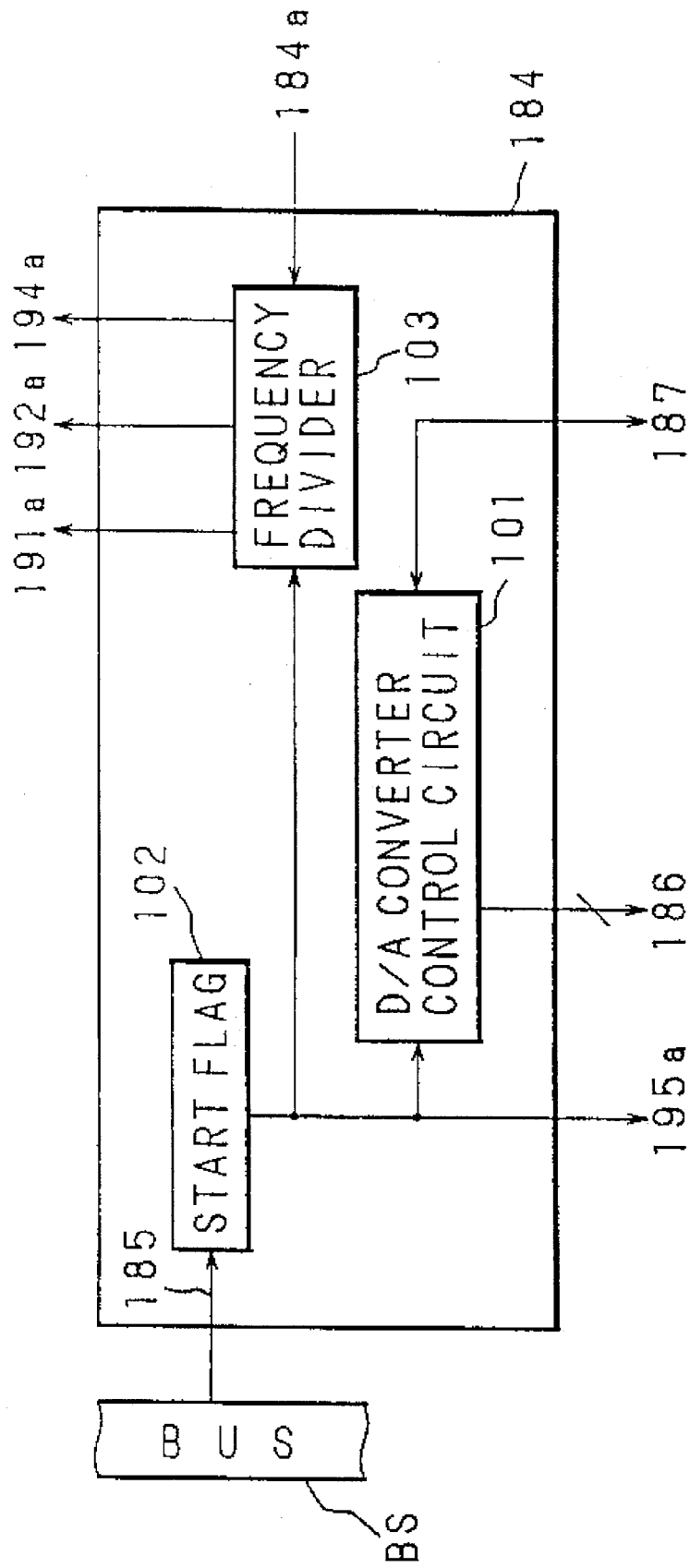
FIG. 3 is a block diagram showing the constitution of a conventional control circuit in the analog/digital converting apparatus of FIG. 1.
Figure 4:
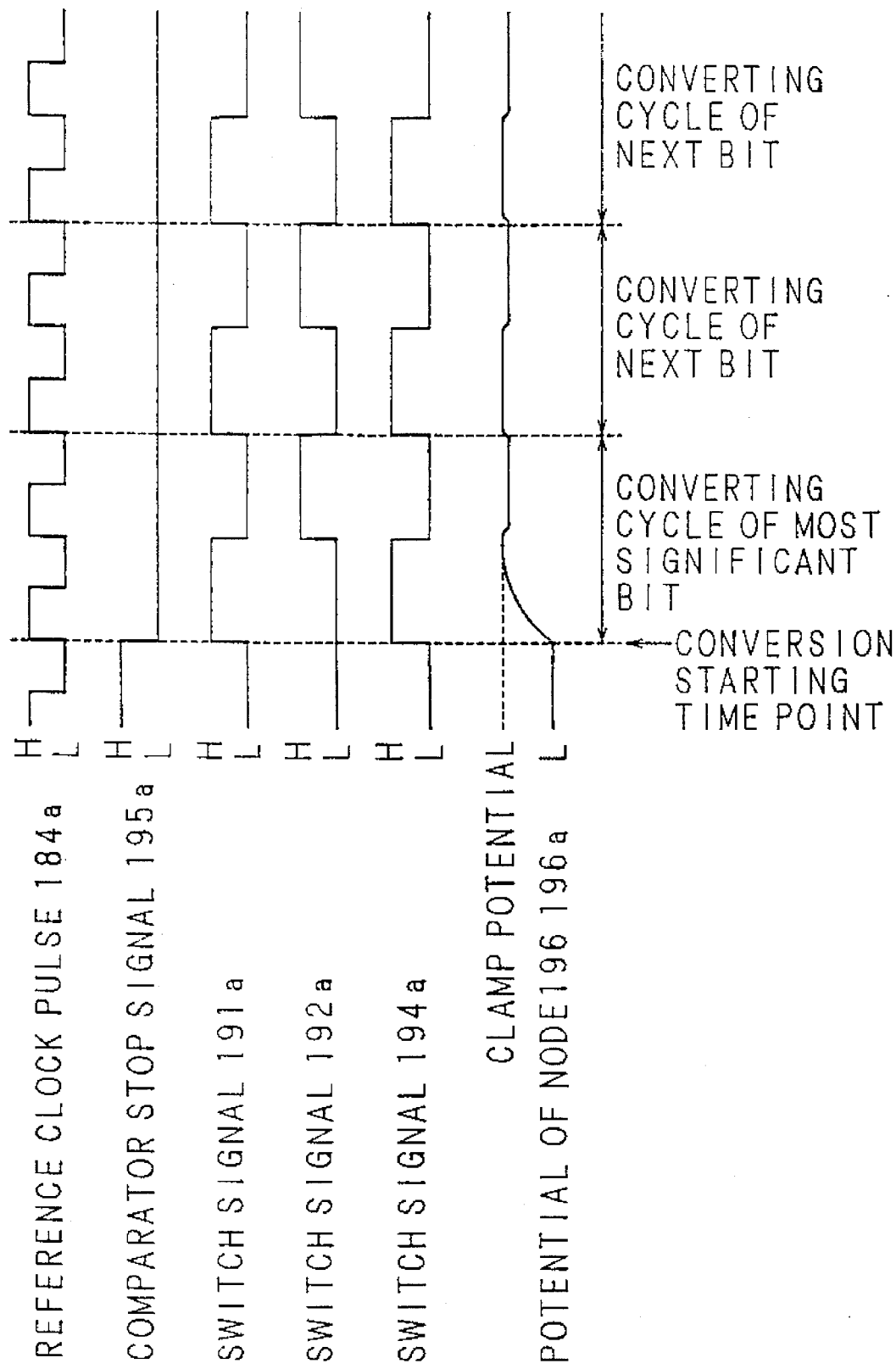
FIG. 4 is a timing chart of signals.

The operation of the comparator in thus constructed analog/digital converting apparatus will be described with referring to the timing chart of signals in FIG. 8. Since the basic operation of the analog/digital converting apparatus is the same as described with reference to FIG. 1, the description thereof is omitted hereinbelow.

Figure 8:
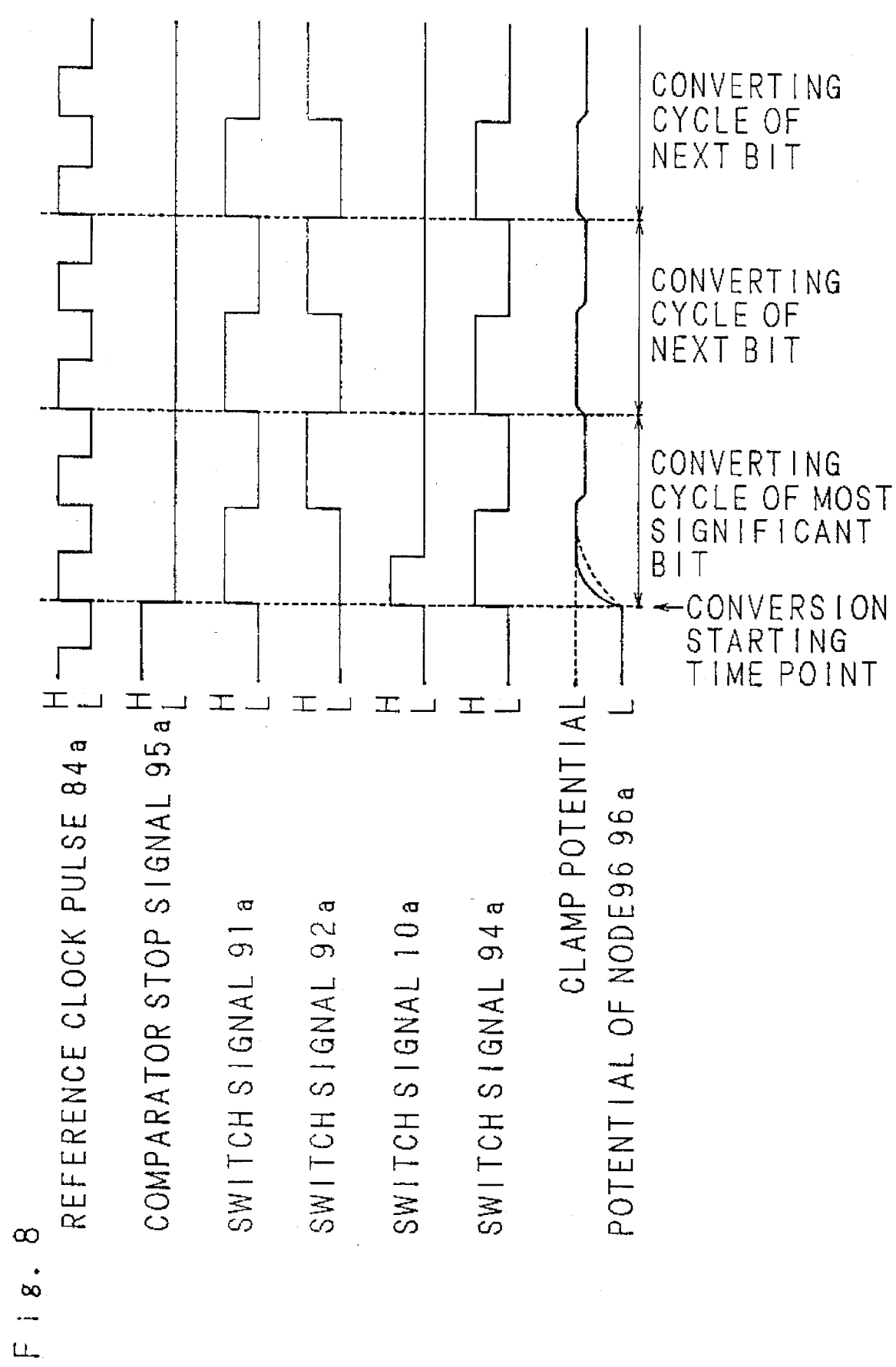
FIG. 8 is a timing chart of signals.

When the most significant bit is to be converted, as shown in FIG. 8, the switch signal 10*a* which is an impulse synchronized with the reference clock pulse 84*a* is produced by the frequency divider 23 which divides the reference clock pulse 84*a*. When the comparator stop signal 95*a* in FIG. 8 becomes L level to start the analog/digital conversion, the potential of the node 96 at the input side of the inverter 93 is increased from the initial state to the clamp potential.

In other words, as shown in FIG. 8, when the switch signals 91*a*, 94*a* become H level, thereby to turn on the transistor 91 and feedback transistor 94, the analog input voltage AVin is supplied to the sampling capacity 90, and consequently the clamp potential is achieved by the feedback transistor 94. At this time, as the switch signal 10*a* is generated, and fed into the gate of the transistor 10 via the inverter 11 or to the gate of the pull down N-channel transistor 97 through the OR circuit 12, the P-channel transistor 10 and pull down N-channel transistor 97 are both turned on. Accordingly, the node 96 is raised to the clamp potential owing to the source voltage of the DC power source Vc.

By thus raising the node 96 to the clamp potential by the source voltage of the DC power source Vc, the time to achieve the clamp potential from the initial potential is significantly reduced as compared with the conventional case indicated by a broken line in FIG. 8.

Thereafter, when the switch signal 10*a* is turned to L level, with the node 96 reducing the clamp potential, the switch signals 91*a*, 94*a* are both changed to L level, whereas the switch signal 92*a* is increased to H level. In consequence to this both of the transistors 91, 94 are turned off, the transistor 92 is turned on, and the reference voltage 88 is fed to the sampling capacity 90.

At this time, when the reference voltage 88 from the D/A converter 81 is higher than the analog input voltage AVin, the sampling capacity 90 charged by the analog input voltage AVin is further charged, thereby increasing the potential of the node 96. Since the increase of the potential of the node 96 represents that a higher potential than the threshold value of the inverter 93 is supplied, the comparison result 89 of L level is obtained.

When the reference voltage 88 from the D/A converter 81 is lower than the analog input voltage AVin, the sampling capacity 90 is discharged, and the potential of the node 96 decreases. Since the decrease of the potential of the node 96 indicates the supply of a lower potential than the threshold value of the inverter 93 the comparison result 89 of H level is output.

As depicted hereinbelow, even if the reference clock pulse 84*a* is increased in speed, a sufficient time is secured for the node 96 to achieve the clamp potential. Accordingly, the conversion time of the most significant bit which obstructs shortening of the analog/digital conversion time of the analog/digital converting apparatus can be positively reduced without enhancing the driving ability of currents of the feedback transistor and inverter which would cause the deterioration of resistances to noises.

Figure 9:
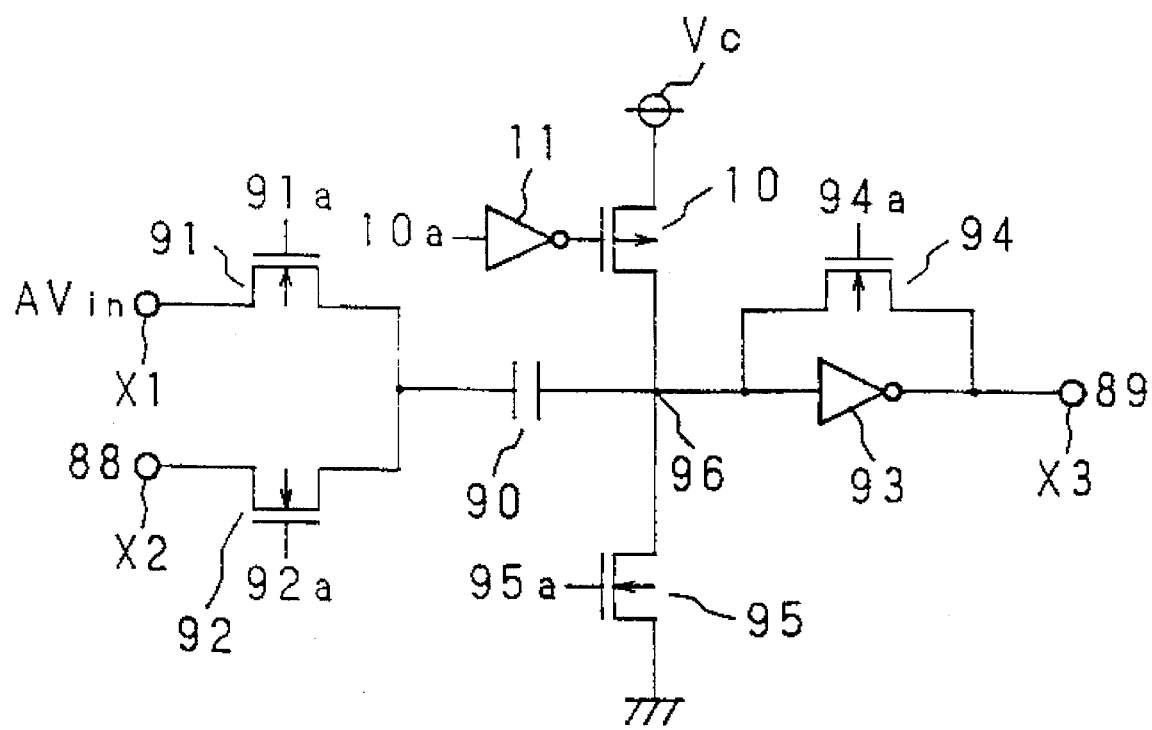
FIG. 9 is a circuit diagram showing the constitution of a second embodiment of a comparator in the analog/digital converting apparatus of the invention.

FIG. 9 is a circuit diagram showing the constitution of a second embodiment of a comparator in the analog/digital converting apparatus of the invention. The comparator stop signal 95*a* is directly fed to a gate of an N-channel transistor 95 connected to the node 96.

The constitution is the same as that of the comparator illustrated in FIG. 5, except for the elimination of the OR circuit 12, and the same parts are designated by the same reference numerals. This comparator of the second embodiment is controlled by the control circuit 84 in FIG. 8.

The operation of the comparator in the analog/digital converting apparatus constituted as above will be explained with reference to FIG. 8 showing the timing chart of signals. Since the fundamental operation of the analog/digital converting apparatus is the same as the operation described with reference to FIG. 1, the detailed explanation thereof is abbreviated.

The switch signal 10*a* of FIG. 8 is generated in the Frequency divider 23 in FIG. 7 only when the most significant bit is to be converted. Supposing that the comparator stop signal 95*a* is brought to level K, the transistor 95 is turned off, thus starting the analog/digital conversion. When the switch signals 91*a*, 94*a* are then turned to H level, the transistors 91, 94 are both turned on, and the analog input voltage AVin is increased to the sampling capacity 90. Consequently, the node 96 is raised to the clamp potential by the feedback transistor 94.

At this time, as shown in FIG. 8, the switch signal 10*a* becomes H level, and the P-channel transistor 10 which is a pull up switching device is turned on. Accordingly, the node 96 exceeds the clamp potential to the source voltage of the DC power source Vc. However, since the time width of the switch signal 10*a* is narrow as is apparent in FIG. 8, the transistor 10 is turned off when the node 96 is brought close to the clamp potential.

In other words, when the node 96 is raised to the clamp potential by the feedback transistor 94, the transistor 10 helps to raise the node 96 with the use of the source voltage of the DC power source Vc. Since the transistor 95 is kept off at the start of the analog/digital conversion, the time for the node 96 to reach the clamp potential is shortened. Thereafter, the switch signal 10*a* is lowered to L level while the node 96 reaches the clamp potential, the switch signals 91*a*, 94*a* are turned to L level, and at the same time the switch signal 92*a* becomes H level. Tile transistors 91, 94 are accordingly turned off, while the transistor 92 is turned on. As the reference voltage 88 is fed to the sampling capacity 90, the inverter 93 generates the comparison result 89.

In the manner as above, since the node 96 is raised to not smaller than the clamp potential by the source voltage, it becomes possible for the node 96 to attain the clamp potential from the initial state in a reduced time. Even if the reference clock pulse 84*a* is at higher speeds, there is allowed a sufficient time for the node 96 to reach the clamp potential. Accordingly, the conversion time of the most significant bit which is a hindrance to shortening of the analog/digital conversion time of the analog/digital converting apparatus can be securely reduced without enhancing the driving ability of the currents of the feedback transistor and inverter which would lead to the deterioration of resistances to noises.

Figure 10:
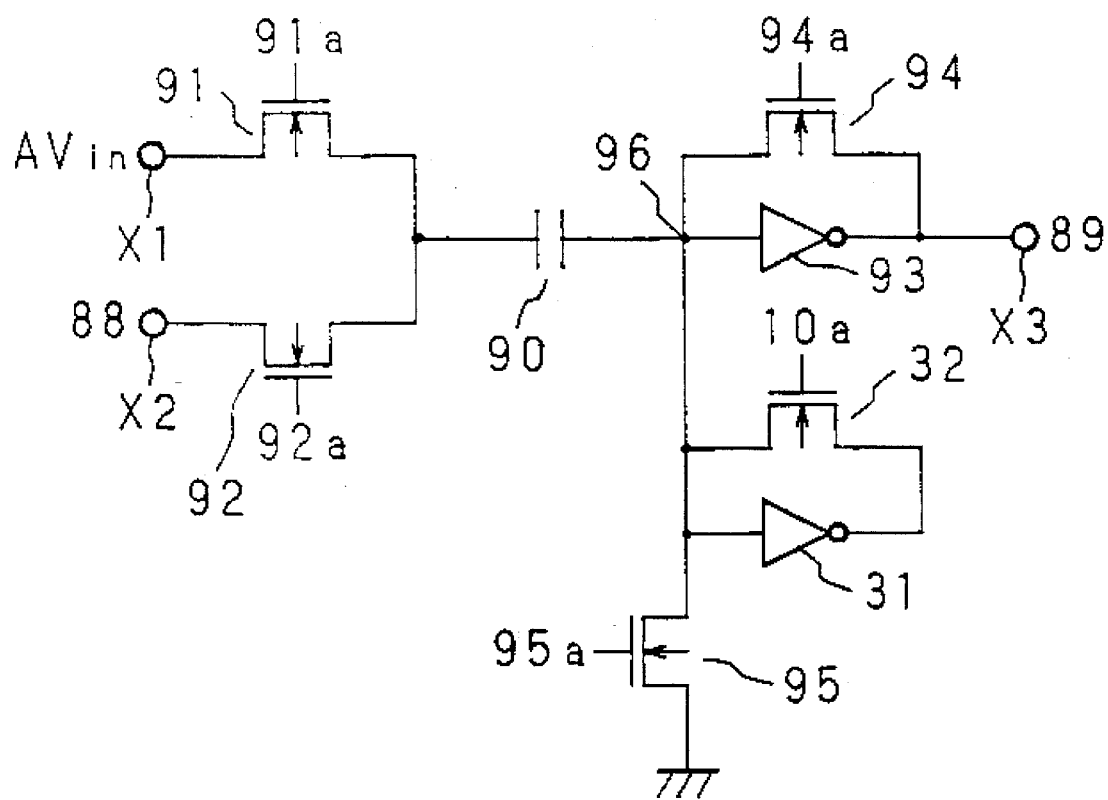
FIG. 10 is a circuit diagram showing the constitution of a third embodiment of a comparator in the analog/digital converting apparatus of the invention.

FIG. 10 is a circuit diagram showing the constitution of a third embodiment of a comparator in the analog/digital converting apparatus of the invention. The node 96 is grounded via the transistor 95, and the comparator stop signal 95a is fed to the gate of the transistor 95. The correcting part of the node 96 and transistor 95 is connected to an input input side of an inverter 31, and an output, side thereof is connected to an output input side of the inverter 31 via an N-channel transistor 32 which is a switching device. The switch signal 10a is fed to the transistor 32. The constitution is similar to that of the comparator shown in FIG. 5, except that the transistor 10, inverter 11, transistor 95, and OR circuit 12 are removed. The same reference numerals represent the same parts. This comparator of the third embodiment is controlled by the control circuit 84 shown in FIG. 7.

The operation of the comparator of the analog/digital converting apparatus in the above-discussed constitution will be described below along with FIG. 8 showing the timing chart of signals. The operation of the analog/digital converting apparatus is substantially the same as mentioned above, and the description of the same parts is omitted.

The switch signal 10a is generated in the frequency divider 23 of FIG. 7 only in case of converting into the most significant bit. Supposing that the comparator stop signal 95a becomes L level as shown in FIG. 8, the transistor 95 is turned off, with starting the analog/digital conversion. When the switch signals 91a, 94a are in H level, both transistors 91, 94 are turned on, and the analog input voltage AVin is supplied to the sampling capacity 90, whereby the node 96 is raised to the clamp potential. At this time, the switch signal 10a is turned to H level, so that the transistor 32 is turned on.

As a result, the output of the inverter 31 is fed back to the input side to raise the potential of the node 96. Specifically, when the node 96 is raised to the clamp potential by the feedback transistor 94, the transistor 32 alike works to raise the node 96 to the clamp potential. Accordingly, the node 96 is able to reach the clamp potential in a short time. When the switch signal 10a signal L level and the node 96 attains the clamp potential, the switch signals 91a, 94a and 92a are changed to L level and H level, respectively. As the transistors 91, 94 are turned off, and the transistor 92 is turned on, then the reference voltage 88 is supplied to the sampling capacity 90, so that the inverter 93 generates the comparison result 89.

In this way, since the clamp potential is increased by the inversion output of the inverter 93 when the node 96 is raised to the clamp potential, the clamp potential is gained in a shorter time from the initial potential. Therefore, even when the reference clock pulse 84a is set at higher speeds, an enough time is ensured for the node 96 to reach the clamp potential. The conversion time into the most significant bit which obstructs shortening of the analog/digital conversion time of the analog/digital converting apparatus can be securely reduced without enhancing the driving ability of currents of the feedback transistor and inverter which might invite the decrease of resistances to noises.

Figure 11:
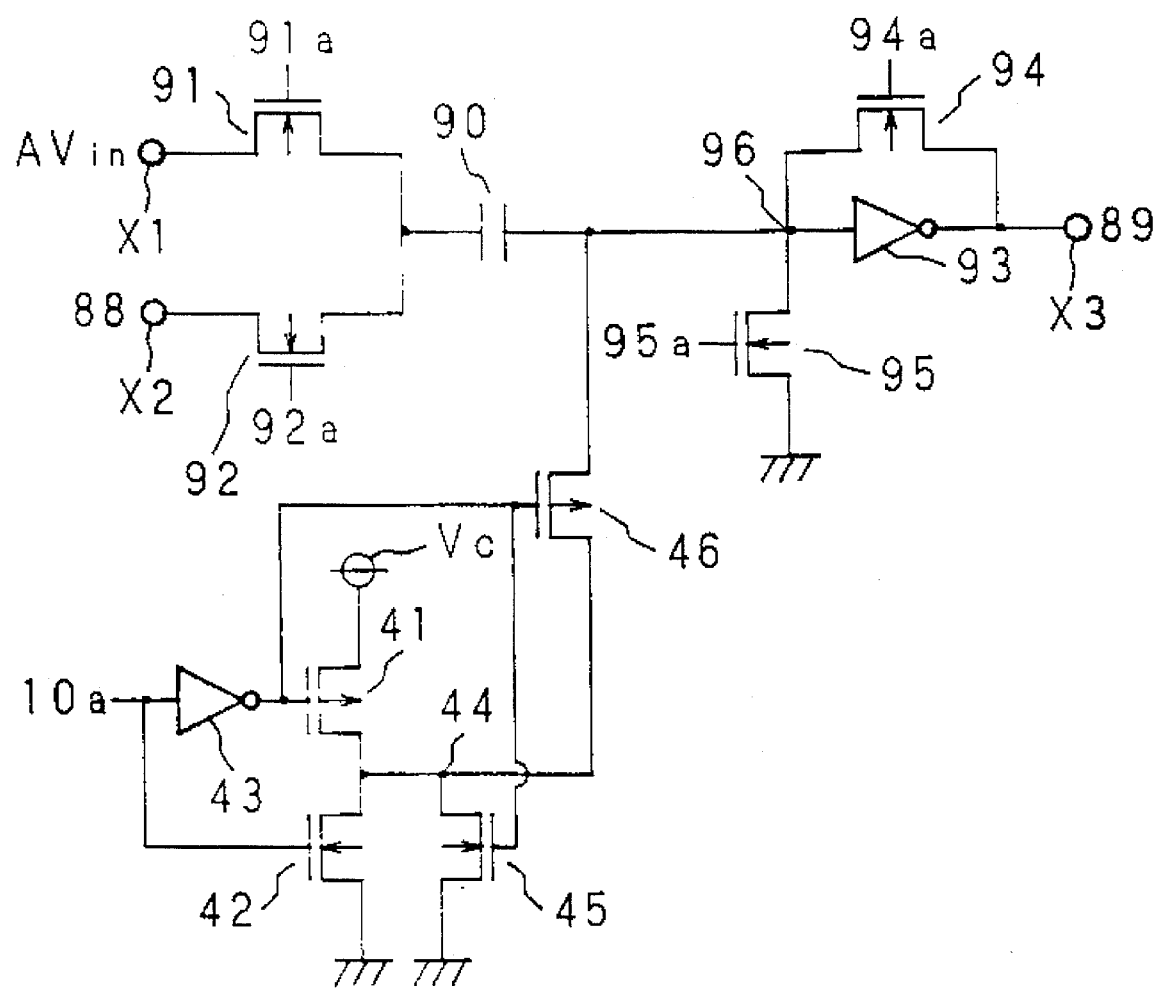
FIG. 11 is a circuit diagram showing the constitution of a fourth embodiment of a comparator in the analog/digital converting apparatus of the invention.

FIG. 11 is a circuit diagram showing the constitution of a fourth embodiment of a comparator in the analog/digital converting apparatus of the invention. The node 96 is grounded via the N-channel transistor 95, and the comparator stop signal 95a is fed to the gate of the transistor 95. The node 96 is also grounded via a series circuit consisting of a P-channel transistor 46 which is a switching device for turning on or off an intermediate potential and an N-channel transistor 45. The DC power source Vc is grounded via a series circuit of a P-channel transistor 41 and an N-channel transistor 42. The connecting part of the transistors 46 and 45 and the connecting part of the transistors 41 and 42 are commonly connected with each other. Moreover, gates of the transistors 46, 45, and 41 are connected in common. The switch signal 10a is fed to the gate of the transistor 41 via the inverter 43, and directly to the gate of the transistor 42.

The constitution in the other points is the same as that of the comparator shown in FIG. 5, except that the inverter 11, transistor 10, OR circuit 12, and transistor 95 are removed, and the same reference numerals as in FIG. 5 are assigned to the same corresponding parts. The comparator 7 of FIG. 11 is controlled by the control circuit 84 in FIG. 7.

The operation of the comparator in the thus composed analog/digital converting apparatus will be described below with referring to the timing chart of signals in FIG. 8. Since the operation of the analog/digital converting apparatus in FIG. 11 is essentially the same as mentioned above, the detailed description is abbreviated for brevity.

The switch signal 10a indicated in FIG. 8 is generated in the frequency divider 23 in FIG. 7 only in case of converting into the most significant bit. Supposing that the comparator stop signal 95a is decreased to L level, the transistor 95 is turned off, when the analog/digital conversion is started. Then, as is shown in FIG. 8, since the switch signals 91a, 94a are turned to H level, both of the transistor 91, 94 are turned on, and the analog input voltage AVin is supplied to the sampling capacity 90, accordingly increasing the potential of the node 96 to the clamp potential.

When the switch signal 10a becomes H level, the transistors 41, 42, and 46 are all actuated. As a result, potential of the node 44 which is an intermediate potential between the DC voltage of the DC power source Vc and the grounding potential is sent to the node 96. That is, while the node 96 is raised to the clamp potential by the feedback transistor 94, the potential of the node 96 is increased by the intermediate potential of the node 44. Accordingly, the node 96 achieves the clamp potential in a short time. After the switch signal 10a becomes L level, and the node 96 reaches the clamp potential, the switch signals 91a, 94a are lowered to L level, and at the same time the switch signal 92a is switched to H level, therefore, the transistors 91, 94 are both turned off, with the transistor 92 being turned on, whereby the reference voltage 88 is impressed to the sampling capacity 90, the inverter 93 generates the comparison result 89. Meanwhile, the transistor 46 is shut when the with signal 10a is decreased to L level, and the transistor 45 is turned on, so that the node 44 is fixed at the grounding potential.

As discussed hereinabove, since the node 96 is raised to the clamp potential with the use of the intermediate potential, the time necessary to achieve the clamp potential from the initial state is shortened. Even in the case where the reference clock pulse 84a is set at higher speeds, a sufficient time allowance is provided for the node 96 to reach the clamp potential. Accordingly, the conversion time of the most significant bit which is an obstruction to shortening of the analog/digital conversion time of the analog/digital converting apparatus can be securely lessened without improving the driving ability of currents of the feedback transistor and inverter which might give rise to the deterioration of resistances against noises.

The operation of the comparator using the comparator shown in FIG. 10 and the control circuit shown in FIG. 7 will be described by referring to the timing chart of signals in FIG. 12. The analog/digital converting apparatus of the embodiment operates substantially in the same manner as mentioned above, and therefore the detailed description of the operation is omitted.

Not only in case of converting into the most significant bit, but also in case of converting into each bit, as shown in FIG. 12, the switch signal 10a which is a clock pulse synchronous with the reference clock pulse 84a is generated by the frequency divider 23. Supposing that the comparator stop signal 95a is turned to L level, the transistor 95 is turned off, thus starting the analog/digital conversion. Since the switch signals 91a, 94a become H level at the time, the transistors 91, 94 are turned on, and the analog input voltage AVin is supplied to the sampling capacity 90. Accordingly, the node 96 is raised to the clamp potential.

At this time, the switch signal 10a becomes H level, and therefore transistor 32 is turned on. As a result, the output of the inverter 31 is fed back to the input side, with raising the potential of the node 96. In other words, when the node 96 is brought up to the clamp potential by means of the feedback transistor 94, the transistor 32 also functions to increase clamp potential. Accordingly, the node 96 reaches the clamp potential in a short time. There-after, when the switch signal 10a becomes L level with the node 96 at the clamp potential, the switch signals 91a, 94a are changed to L level, whereas the switch signal 92a is turned to H level, the transistors 91, 94 are both turned off, and the transistor 92 is turned on. In consequence, the reference voltage 88 is fed to the sampling capacity 90, and the inverter 93 outputs the comparison result 89. The conversion of the most significant bit is thus completed.

As the start of the conversion into a next bit, the switch signal 10a is generated to efficiently raise the potential of the node 96 in a short time, similar to the case of converting into the most significant bit. When each bit is converted afterwards, the node 96 is raised to the clamp potential in a short time by the inversion output of the inverter 31, and then the reference voltage 88 is fed to the sampling capacity 90. Therefore, it becomes possible to achieve to the clamp potential in a short time even if the potential of the node 96 is varied at the conversion into each bit.

As is discussed hereinabove, because of the switch signal 10a generated at the conversion into each bit, a sufficient time is allowed for the node 96 to reach the clamp potential even if the reference clock pulse is set at higher speeds. Accordingly, the conversion time into each bit which is a hindrance to shortening of the analog/digital conversion time of the analog/digital converting apparatus can be surely reduced at the time of converting into each bit without enhancing the driving ability of currents of the feedback transistor and inverter which would cause the decrease of resistances to noises.

In the foregoing embodiment, the comparator is so arranged that, the switch signal 10a is generated at the conversion into each bit. However, the comparators of FIG. 5, 9 and 10 may be adapted to generate the switch signal 10a similarly when each bit is to be converted, with the same effect realized.

Although the converting apparatus in each of the foregoing embodiments is described to be built in a micro-computer, it may be incorporated in a digital IC or an analog IC and may be used alone. The same effect is accomplished as well.

According to the invention, since the switching devices are provided to supply the source voltage of DC power source, inversion output of the inverter, or specified potential to the connecting part of the sampling capacity and inverter, the time for the connecting part to attain the clamp potential is remarkably reduced. Therefore, the conversion time of the most significant bit which obstructs the reduction of the analog/digital conversion time of the analog/digital converting apparatus can be securely shortened without enhancing the driving ability of currents of the feedback transistor and inverter which would result in the deterioration of resistances to noises.

Moreover, since the source voltage, inversion output of the inverter or predetermined potential is applied to the connecting part of the sampling capacity and inverter at the time of converting into each bit, the ability of the feed-back switching device of the comparator or the inverter to drive the current may be restricted unless the high-speed conversion is needed. Therefore, the comparator is turned resistive to noises, hardly accompanying an erroneous operation. The present invention provides the analog/digital converting apparatus not generating the deterioration of the conversion accuracy even at the high-speed analog/digital conversion, with an erroneous operation responsive to noises avoided.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within the metes and bounds of the claims, or equivalence of such metes and bounds thereof are therefore intended to be embraced by the claims.

What is claimed is:

1. An analog/digital converting apparatus for comparing sequentially an analog input voltage with different analog reference voltages, storing the results of comparison as converted digital data having bits from higher order bits in a successive approximation register, and outputting the data stored in said successive approximation register, comprising:

a first node and a second node;

a sampling capacity connected to said first and second nodes, for selectively receiving said analog reference voltage and said analog input voltage;

an inverter connected to said second node and in series to said sampling capacity, for outputting said comparison result to said successive approximation register in accordance with the amount of change in potential at said second node;

a pull up switching device and a pull down switching device connected to said second node; and a control circuit for controlling said switching devices, so that said pull up switching device and pull down switching device become conductive only during the converting cycle of the most significant bit.

2. An analog/digital converting apparatus according to claim 1, wherein said control circuit includes:

a frequency divider for dividing a reference clock pulse as a reference of the comparison cycle of each bit, and supplying a pulse synchronous with said reference clock pulse to said pull up switching device and pull down switching device so as to make said pull up switching device and pull down switching device, conductive during the converting cycle of the most significant bit.

3. An analog/digital converting apparatus for comparing sequentially an analog input voltage with different analog reference voltages, storing the results of comparison as converted digital data having bits from higher order bits in a successive approximation register, and outputting the data stored in said successive approximation register, comprising:

a first node and a second node;

a sampling capacity directly connected to said first and second nodes, for selectively receiving said analog reference voltage and said analog input voltage;

an inverter directly connected to said second node and in series to said sampling capacity, for outputting said comparison result to said successive approximation register in accordance with the amount of change in potential at said second node;

a pull up switching device and a pull down switching device directly connected to said second node; and a control circuit for controlling said switching devices so that said pull up switching device and pull down switching device become simultaneously conductive during the converting cycle of each bit.

4. An analog/digital converting apparatus according to claim 3, wherein said control circuit includes:

a frequency divider for dividing a reference clock pulse as a reference of the comparison cycle of each bit, and supplying a pulse synchronous with said reference clock pulse to said pull up switching device and pull down switching device so as to make said pull up switching device and pull down switching device conductive during the converting cycle of each bit.

5. An analog/digital converting apparatus for comparing sequentially an analog input voltage with different analog reference voltages, storing the results of comparison as converted digital data having bits from higher order bits in a successive approximation register, and outputting the data stored in said successive approximation register, comprising:

a first and second node;

a sampling capacity connected to said first and second nodes, for selectively receiving said analog reference voltage and said analog input voltage;

an inverter connected to said second node and in series to said sampling capacity, for outputting said comparison result to said successive approximation register in accordance with the amount of change in potential at said second node;

a pull up switching device connected to said second node and a control circuit for controlling said switching device, so that said pull up switching device becomes conductive only during the converting cycle of the most significant bit.

6. An analog/digital converting apparatus according to claim 5, wherein said control circuit includes:

a frequency divider for dividing a reference clock pulse as a reference of the comparison cycle of each bit, and applying a pulse synchronous with said reference clock pulse to said pull up switching device so as to make said pull up switching device conductive only during the converting cycle of the most significant bit.

7. An analog/digital converting apparatus for comparing sequentially an analog input voltage with different analog reference voltages, storing the results of comparison as converted digital data having bits from higher order bits in a successive approximation register, and outputting the data stored in said successive approximation register, comprising:

a first and a second node;

a sampling capacity directly connected to said first and second nodes, for selectively receiving said analog reference voltage and said analog input voltage;

an inverter directly connected to said second node and in series to said sampling capacity, for outputting said comparison result to said successive approximation register in accordance with the amount of change in potential at said second node;

a pull up switching device directly connected to said second node and a control circuit for controlling said pull up switching device so that said pull up switching device becomes conductive during the converting cycle of each bit.

8. An analog/digital converting apparatus according to claim 7, wherein said control circuit includes:

a frequency divider for dividing a reference clock pulse as a reference of the comparison cycle of each bit, and supplying a pulse synchronous with said reference clock pulse to said pull up switching device so as to make said pull up switching device conductive during the converting cycle of each bit.

9. An analog/digital converting apparatus for comparing sequentially an analog input voltage with different analog reference voltages, storing the results of comparison as converted digital data having bits from higher order bits in a successive approximation register, and outputting the data stored in said successive approximation register, comprising:

a first node and a second node;

a sampling capacity connected to said first and second nodes, for selectively receiving said analog reference voltage and said analog input voltage;

an inverter connected to said second node and in series to said sampling capacity, for outputting said comparison result to said successive approximation register in accordance with the amount of change in potential at said second node a second inverter connected to said second node;

a switching device for feeding back an output of said second inverter to the input side thereof; and a control circuit for controlling said switching device so that said switching device becomes conductive only during the converting cycle of the most significant bit.

10. An analog/digital converting apparatus according to claim 9, wherein said control circuit includes:

a frequency divider for dividing a reference clock pulse as a reference of the comparison cycle of each bit, and supplying a pulse synchronous with said reference clock pulse to said switching device so as to make said switching device conductive during the converting cycle of the most significant bit.

11. An analog/digital converting apparatus for comparing sequentially an analog input voltage with different analog reference voltages, storing the results of comparison as converted digital data having bits from higher order bits in a successive approximation register, and outputting the data stored in said successive approximation register, comprising:

a first node and a second node;

a sampling capacity connected to said first and second nodes, for receiving said analog reference voltage and said analog input voltage;

an inverter connected to said second node and in series to said sampling capacity, for outputting said comparison result to said successive approximation register in accordance with the amount of change in potential at said second node;

a second inverter connected to said second node;

a switching device for feeding back an output of said second inverter to the input side thereof; and a control circuit for controlling said switching device, so that said switching device becomes conductive during the converting cycle of each bit.

12. An analog/digital converting apparatus according to claim 11, wherein said control circuit includes:

a frequency divider for dividing a reference clock pulse as a reference of the comparison cycle of each bit, and supplying a pulse synchronous with said reference clock pulse to said switching device so as to make said switching device conductive during the converting cycle of each bit.

13. An analog/digital converting apparatus for comparing sequentially an analog input voltage with different analog reference voltages, storing the results of comparison as converted digital data having bits from higher order bits in a successive approximation register, and outputting the data stored in said successive approximation register, comprising:

a first node and a second node;

a sampling capacity connected to said first and second nodes, for selectively receiving said analog reference voltage and said analog input voltage;

an inverter connected to said second node and in series to said sampling capacity, for outputting said comparison result to said successive approximation register in accordance with the amount of change in potential at said second node;

a circuit coupled to said second node for generating an intermediate potential between a source potential and a grounding potential;

a switching device connected to said circuit for generating and to said second node for applying said intermediate potential to said second node; and a control circuit for controlling said switching device, so that said switching device becomes conductive only during the converting cycle of the most significant bit.

14. An analog/digital converting apparatus according to claim 13, wherein said control circuit includes:

a frequency divider for dividing a reference clock pulse as a reference of the comparison cycle of each bit, and supplying a pulse synchronous with said reference clock pulse to said switching device so as to make said switching device conductive during the connecting cycle of the most significant bit.

15. An analog/digital converting apparatus for comparing sequentially an analog input voltage with different analog reference voltages, storing the results of comparison as converted digital data having bits from higher order bits in a successive approximation register, and outputting the data stored in said successive approximation register, comprising:

a first node and a second node;

a sampling capacity directly connected to said first and second nodes, for selectively receiving said analog reference voltage and said analog input voltage;

an inverter directly connected to said second node and in series to said sampling capacity, for outputting said comparison result to said successive approximation register in accordance with the amount of change in potential at said second node;

a circuit coupled to said second node for generating an intermediate potential between a source potential and a grounding potential;

a switching device directly connected to said circuit for generating and said second node for applying said intermediate potential to said second node; and a control circuit for controlling said switching device so that said switching device becomes conductive during the converting cycle of each bit.

16. An analog/digital converting apparatus according to claim 15, wherein said control circuit includes:

a frequency divider for dividing a reference clock pulse as a reference of the comparison cycle of each bit, and supplying a pulse synchronous with said reference clock pulse to said switching device so as to make said switching device conductive during the converting cycle of each bit.

* * * * *